United States Patent
Hwang

(10) Patent No.: US 8,373,190 B2
(45) Date of Patent: Feb. 12, 2013

(54) LIGHT EMITTING DEVICE, LIGHT EMITTING DEVICE PACKAGE, AND LIGHTING SYSTEM INCLUDING THE SAME

(75) Inventor: Sung Min Hwang, Anyang-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/409,612

(22) Filed: Mar. 1, 2012

(65) Prior Publication Data

US 2012/0161188 A1 Jun. 28, 2012

Related U.S. Application Data

(63) Continuation of application No. 12/768,228, filed on Apr. 27, 2010, now Pat. No. 8,222,660.

(30) Foreign Application Priority Data

Apr. 28, 2009 (KR) .................. 10-2009-0036982

(51) Int. Cl.
*H01L 33/00* (2010.01)

(52) U.S. Cl. ............... 257/98; 257/79; 257/103; 257/94

(58) Field of Classification Search .................... 257/79, 257/98, 94, 103
See application file for complete search history.

(56) References Cited

U.S. PATENT DOCUMENTS

| | | | |
|---|---|---|---|
| 4,316,208 A | | 2/1982 | Kobayashi et al. |
| 4,429,397 A * | | 1/1984 | Sugimoto et al. .......... 372/46.01 |
| 6,492,661 B1 | | 12/2002 | Chien et al. |
| 7,867,885 B2 | | 1/2011 | Bae |
| 7,872,266 B2 | | 1/2011 | Choi et al. |
| 7,977,683 B2 | | 7/2011 | Moon |
| 2005/0168899 A1 | | 8/2005 | Sato et al. |
| 2006/0145164 A1* | | 7/2006 | Illek et al. .................. 257/79 |
| 2007/0224831 A1 | | 9/2007 | Bae |
| 2007/0278499 A1 | | 12/2007 | Ha et al. |
| 2008/0185606 A1 | | 8/2008 | Sano et al. |
| 2009/0050916 A1 | | 2/2009 | Katsuno et al. |
| 2010/0163902 A1 | | 7/2010 | Moon |
| 2010/0213481 A1 | | 8/2010 | Hwang |
| 2010/0230699 A1 | | 9/2010 | Song |
| 2010/0330717 A1 | | 12/2010 | Choi et al. |

FOREIGN PATENT DOCUMENTS

| | | |
|---|---|---|
| JP | 2004-047504 | 2/2004 |
| JP | 2008-205005 | 9/2008 |
| KR | 2008-0075348 | 8/2008 |
| KR | 2008-0079844 | 9/2008 |

OTHER PUBLICATIONS

European Search Report dated Aug. 2, 2010.
Chang, S J et al: Improved ESD protection by combining InGaN-GaN MQW LEDs With GaN schottky diodes; IEEE Electron Device Letters, IEEE Service Center, New York, NY, US LNKD-DOI:10.1109/LED.2003/809043, vol. 24, No. 3, Mar. 1, 2003, pp. 129-131, XP011097102 ISSN: 0741-3106 *figure 1*.
Korean Notice of Allowance dated Aug. 4, 010 issued in Application No. 10-2009-0036982.

(Continued)

*Primary Examiner* — Telly Green
(74) *Attorney, Agent, or Firm* — KED & Associates, LLP

(57) ABSTRACT

Provided are a light emitting device, a light emitting device package, and a lighting system including the light emitting device and the light emitting device package. The light emitting device includes a light emitting structure, a dielectric, a second electrode layer, a semiconductor region, and a first electrode. The light emitting device includes a plurality of semiconductor layers that form a heterojunction that produces light and a homojunction that protects the device from a reverse current.

18 Claims, 7 Drawing Sheets

OTHER PUBLICATIONS

U.S. Office Action dated Aug. 22, 2011 (U.S. Appl. No. 12/768,228).
U.S. Notice of Allowance dated Dec. 5, 2011 (U.S. Appl. No. 12/768,228).
U.S. Supplemental Notice of Allowance dated Jan. 6, 2012 (U.S. Appl. No. 12/768,228).

* cited by examiner

LIGHT EMITTING DEVICE, LIGHT EMITTING DEVICE PACKAGE, AND LIGHTING SYSTEM INCLUDING THE SAME

CROSS-REFERENCE TO RELATED APPLICATION(S)

This application is a continuation of U.S. application Ser. No. 12/768,228 filed on Apr. 27, 2010 now U.S. Pat. No. 8,222,660 claiming the benefit of Korean Patent Application No. 10-2009-0036982, filed in Korea on Apr. 28, 2009, both of which are hereby incorporated by reference for all purpose as if fully set forth herein.

BACKGROUND

1. Field

Light emitting device, package, and system are disclosed herein.

2. Background

A light emitting device, a light emitting device package, and a lighting system including the same are known. However, they suffer from various disadvantages.

BRIEF DESCRIPTION OF THE DRAWINGS

The embodiments will be described in detail with reference to the following drawings in which like reference numerals refer to like elements, wherein.

DETAILED DESCRIPTION

Nitride semiconductors are used in optical devices and high-power electronic devices because of their high thermal stability and wide band gap energy. For example, blue light emitting diodes (LEDs), green LEDs, and UV LEDs use nitride semiconductors. However, LEDs may be damaged by an electrostatic discharge (ESD). An ESD may cause a reverse current in the LED that may damage an active layer, such as, for example, a light emitting region.

Figure 1:
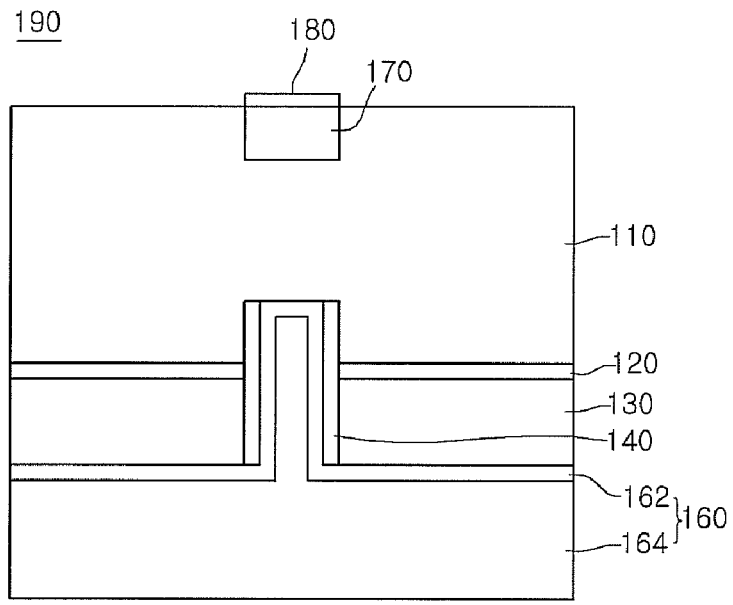
FIG. 1 is a cross-sectional view of a light emitting device according to an embodiment.

FIG. 1 is a cross-sectional view of a light emitting device according to an embodiment. The light emitting device according to this embodiment may include a light emitting structure, a dielectric 140, a second electrode layer 160, a semiconductor region 170 of a second conductive type, and a first electrode layer 180. The light emitting structure includes a first semiconductor layer 110 of a first conductive type, an active layer 120, and a second semiconductor layer 130 of the second conductive type. The dielectric 140 is disposed on a region in which a portion of the light emitting structure is removed. The second electrode layer 160 is disposed under the light emitting structure. The semiconductor region 170 of the second conductive type is disposed on the first semiconductor layer 110 of the first conductive type. The first electrode layer 180 is disposed on the semiconductor region 170 of the second conductive type. The light emitting device is described further hereinbelow.

Figure 2A:
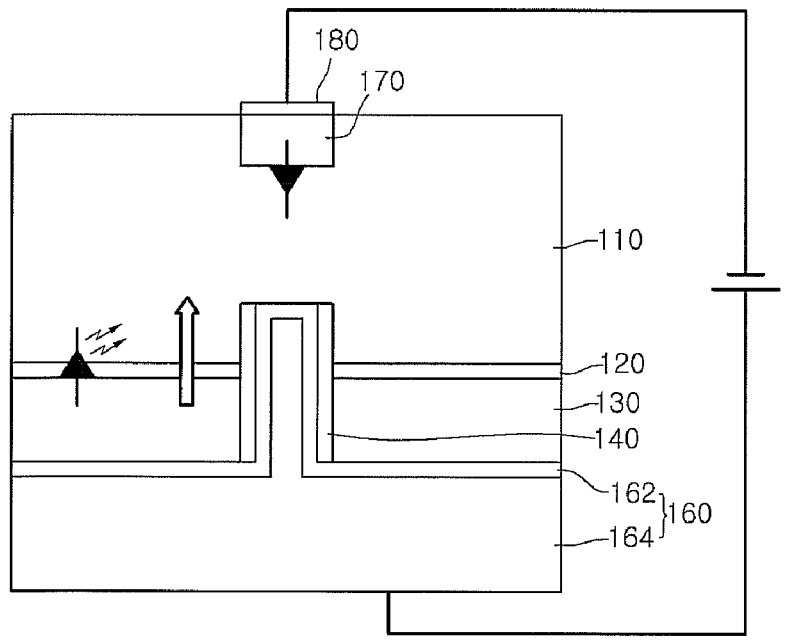
FIGS. 2A and 2B are schematic views illustrating operations of a light emitting device according to an embodiment.
Figure 2B:
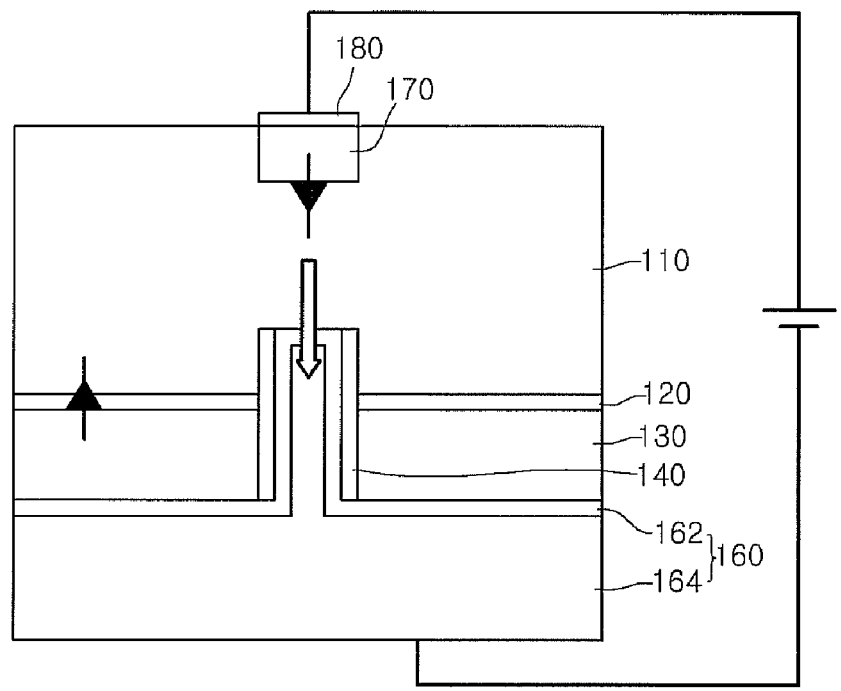
Figure 2C:
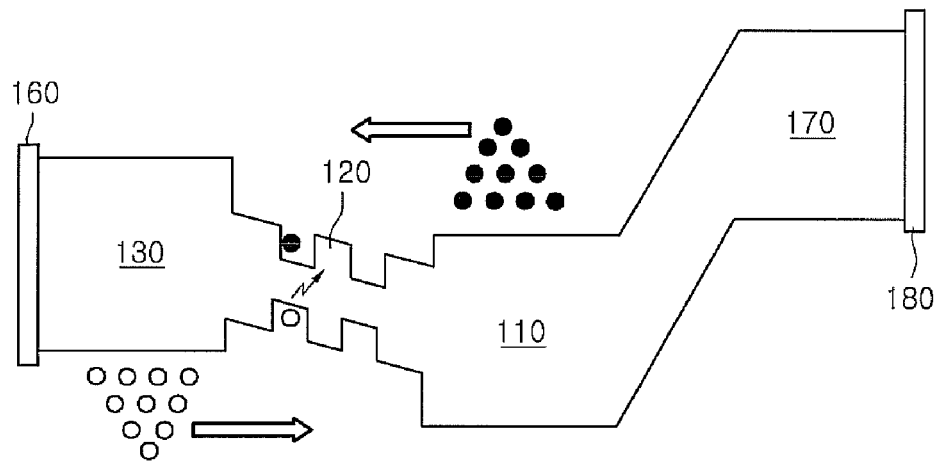
FIG. 2C is an energy band diagram of a light emitting device according to an embodiment.

FIGS. 2A and 2B are schematic views illustrating operations of the light emitting device according to an embodiment. FIG. 2C is an energy band diagram of the light emitting device according to this embodiment.

According to this embodiment, both a heterojunction and a homojunction may be formed together in the light emitting structure. The homojunction may include a p-n junction. The heterojunction may include a central material, for example, the active layer, between a p-type and an n-type semiconductor material. The heterojunction, including the active layer, of the light emitting structure may emit light when forward biased, while the homojunction of the light emitting device may protect the active layer from a reverse voltage caused by an electrostatic discharge (ESD) shock by allowing a reverse current to bypass the active layer. Layers forming a p-n-p junction and a p-n junction are exemplified in FIGS. 2A to 2C, but the present disclosure is not limited thereto. For example, the layers may be configured to form an n-p-n junction and a p-n junction.

FIG. 2A is a schematic view illustrating an operation of the light emitting device when a forward voltage is applied. Referring to FIG. 2A, in the light emitting device according to this embodiment, a current may flow from the second semiconductor layer 130 of the second conductive type to the first semiconductor layer 110 of the first conductive type when a forward voltage is applied. Under forward bias, a band gap may be adjusted and carriers may be injected from both sides of the junction between the first semiconductor layer 110 and the second semiconductor layer 130 to form an excess of electrons and holes at the junction. The excess carriers at the junction may recombine to generate light in the active layer 120, for example, the light emitting region. Further, the heterojunction, including the first semiconductor layer 110, the active layer 120, and the second semiconductor layer 130, may increase the efficiency of the device over a light emitting structure comprising a homojunction, for example, the p-n junction, by providing excess carriers at the junction. However, a homojunction may also be used as the light emitting structure.

FIG. 2B is a schematic view illustrating an operation of the light emitting device when a reverse voltage is applied. Referring to FIG. 2B, in the light emitting device according to this embodiment, a current may flow from the first semiconductor layer 110 to the second electrode layer 160, bypassing the active layer 120 and the second semiconductor layer 130, when a reverse voltage is applied by an ESD. Thus, the active layer 120, for example, the light emitting region, may be protected from damage.

The light emitting device according to this embodiment may have an energy band diagram as shown in FIG. 2C. Since a forward current of the light emitting device corresponds to a reverse current with respect to the junction between the semiconductor region 170 of the second conductive type and the first semiconductor layer 110 of a first conductive type, a depletion region of the semiconductor region 170 may be expanded. Thus, electrons injected from the outside may be diffused through the first semiconductor layer 110 to the active layer 120. In one embodiment, the semiconductor region 170 may be configured to be sufficiently thin to promote a tunneling process, such that a reverse current may flow through the semiconductor region 170. Further, vertical and horizontal current spreading due to the semiconductor region 170 disposed under the first electrode layer 180 may improve extraction, or optical, efficiency.

Generally, a depletion region at a semiconductor junction increases when reverse biased, and decreases when forward biased. Thus, as a reverse current caused by an electrostatic discharge corresponds to a forward current at the junction between the semiconductor region 170 and the first semiconductor layer 110, a neutral region may be present near the semiconductor region 170. Therefore, a depletion region may be generated only in a limited region at the junction between the semiconductor region 170 and the first semiconductor layer 110. Further, a blocking layer may be disposed between the active layer 120 and both the second semiconductor layer 130 of the second conductive type and the first semiconductor layer 110 of the first conductive type to prevent an overflow of electrons or holes near the active layer 120.

As previously described, in a light emitting device according to an embodiment, layers forming both a heterojunction and a homojunction may be formed together in the light emitting device, wherein a forward bias of the heterojunction corresponds to a reverse bias of the homojunction. The heterojunction may be configured to generate light, while the homojunction may be configured to protect the active layer of the heterojunction. For example, a reverse current, such as that created by an ESD shock, may pass through the homojunction into the second electrode layer, bypassing the active layer, thereby protecting the active layer from the ESD shock.

FIGS. 3 to 7 illustrates a method of manufacturing a light emitting device.

Figure 3:
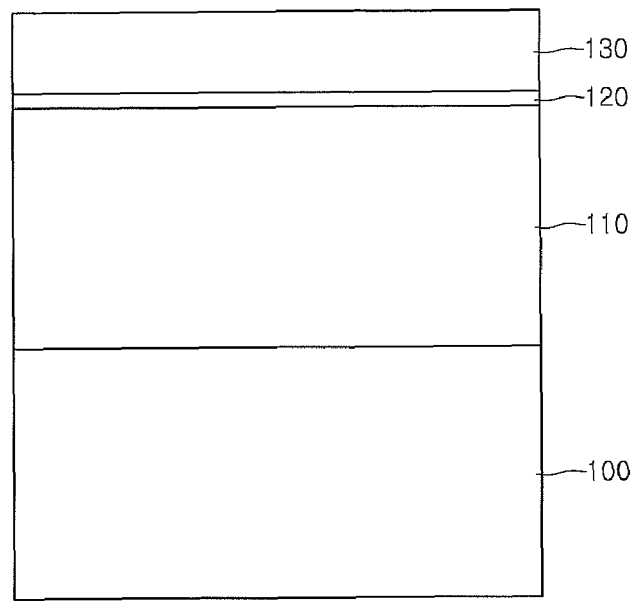
FIGS. 3 to 7 are cross-sectional views illustrating a method of manufacturing a light emitting device according to an embodiment.

Referring to FIG. 3, the light emitting structure including the first semiconductor layer 110 of the first conductive type, the active layer 120, and the second semiconductor layer 130 of the second conductive type may be formed on a first substrate 100. In this embodiment, semiconductor layers 110, 120, and 130 of the light emitting structure may be first formed on the first substrate 100. Thereafter, the second electrode layer 160 may be formed, after which the first substrate 100 may be removed. However, the present disclosure is not limited thereto.

The first substrate 100 may be a sapphire substrate ($Al_2O_3$), an SiC substrate, or other appropriate material based on the intended use of the material. A wet cleaning process may be performed on the first substrate 100 to remove impurities from its surface.

Thereafter, the first semiconductor layer 110 of the first conductive type may be formed on the first substrate 100. For example, the first semiconductor layer 110 of the first conductive type may be formed as an n-type GaN layer by using a method such as a chemical vapor deposition (CVD) method, a molecular beam epitaxy (MBE) method, a sputtering method, a hydride vapor phase epitaxial (HVPE) method, or other appropriate methods. Also, the first semiconductor layer 110 of the first conductive type may be formed by injecting trimethylgallium gas (TMGa), ammonia gas ($NH_3$), nitrogen gas ($N_2$), silane gas ($SiH_4$), or other appropriate gases containing an n-type impurity, such as silicon (Si) into a chamber.

At this point, in one embodiment, an undoped semiconductor layer may be formed on the first substrate 100, and the first semiconductor layer 110 of the first conductive type may be formed on the undoped semiconductor layer.

Next, the active layer 120 may be formed on the first semiconductor layer 110. In the active layer 120, electrons injected through the first semiconductor layer 110 of the first conductive type may combine with holes injected through the second semiconductor layer 130 of the second conductive type to emit light having energy that is determined by an energy band of a material constituting the active layer (light emitting layer). The active layer 120 may have a quantum well structure that may be formed by alternately stacking nitride semiconductor thin layers having different energy bands. For example, the active layer 120 may have a multi-quantum well structure with an InGaN/GaN structure formed by injecting trimethylgallium (TMGa) gas, ammonia ($NH_3$) gas, nitrogen ($N_2$) gas, and trimethylindium (TMIn) gas, but the present disclosure is not limited thereto.

The active layer 120 may have at least one structure of a single quantum well structure, a multi-quantum well structure, a quantum wire structure, a quantum dot structure, or other appropriate structures. For example, in the active layer 120, trimethyl gallium (TMGa) gas, ammonia ($NH_3$) gas, nitrogen ($N_2$) gas, trimethyl indium (TMIn) gas, or other appropriate gases may be injected to form the multiquantum-well structure, but is not limited thereto. The active layer 120 may have one or more structures of an InGaN/GaN structure, an InGaN/InGaN structure, an AlGaN/GaN structure, an InAlGaN/GaN structure, a GaAs/AlGaAs(InGaAs) structure, a GaP/AlGaP(InGaP) structure, or other appropriate structures.

Thereafter, the second semiconductor layer 130 of the second conductive type may be formed on the active layer 120. For example, the second semiconductor layer 130 of the second conductive type may be formed as a p-type GaN layer that may be formed by injecting trimethylgallium (TMGa) gas, ammonia ($NH_3$) gas, nitrogen ($N_2$) gas, bis-ethyl-cyclopentadienyl-magnesium ($EtCp_2Mg$){$Mg(C_2H_5C_5H_4)_2$}, or other appropriate gases that includes a p-type impurity, such as magnesium (Mg), into a chamber, but the present disclosure is not limited thereto.

Figure 4:
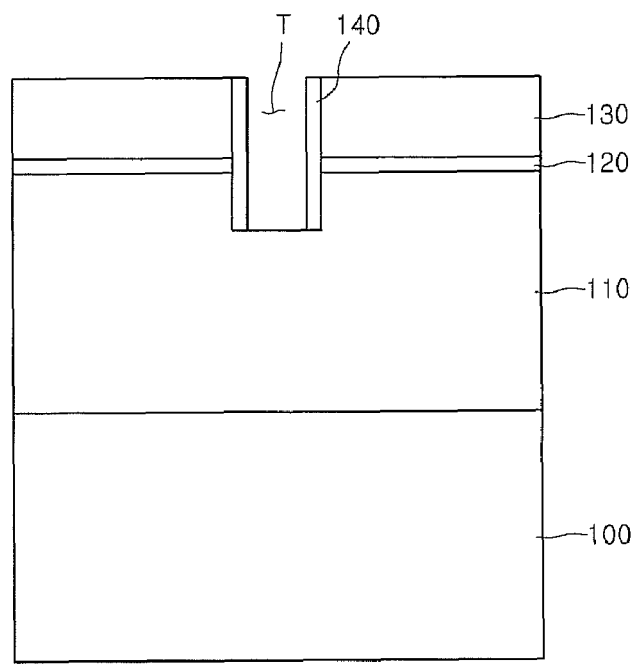

Next, referring to FIG. 4, the second semiconductor layer 130, the active layer 120, and the first semiconductor layer 110 are partially removed to form a predetermined region, or a recess. In this embodiment, the predetermined region or the recess may be a trench T, but is not limited thereto. For example, the predetermined region may be formed by an etching process, using a first pattern as a mask, from the second semiconductor layer 130 into a portion of the first semiconductor layer 110, so as to form the trench T. In addition, for example, the trench T may be etched at a location on the second semiconductor layer 130 which spatially and vertically corresponds to a location where the semiconductor region 170 may be formed, until a portion of the first semiconductor layer 110 is exposed. The etching process for forming the trench T may be a wet, dry, or other appropriate etching process.

Thereafter, the dielectric 140 may be formed on a side surface of the trench T. The dielectric 140 may be a nitride or an oxide, such as SiN and $SiO_2$, or other suitable dielectric material. The dielectric 140 may be formed using a second pattern that exposes the side surface of the trench T to deposit the dielectric material on the side surface, after which the second pattern may be removed so as to complete the dielectric 140, but the present disclosure is not limited thereto. For example, the dielectric 140 may be formed on the side surface of the trench T by depositing dielectric material on all surfaces of the trench T, then performing blanket etching through etch back.

Figure 5:
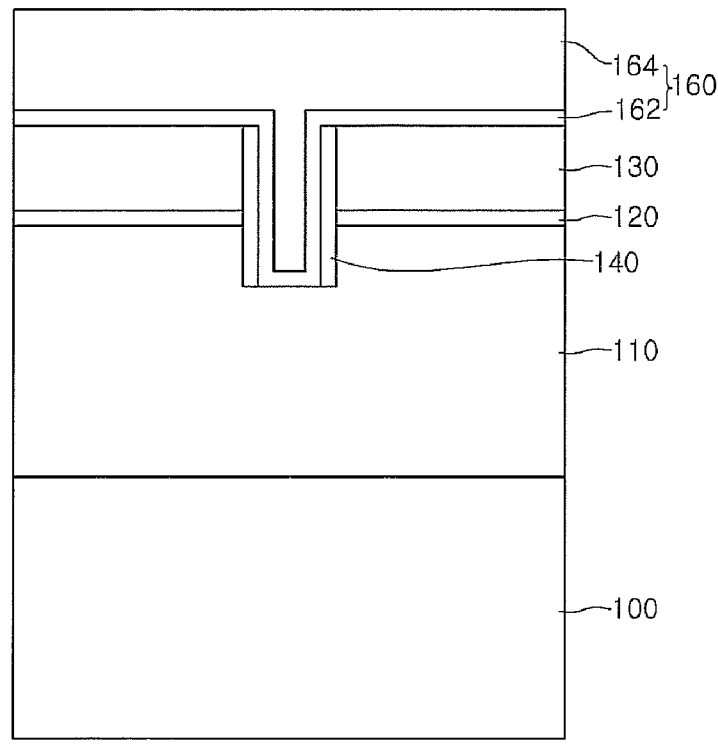

Referring to FIG. 5, the second electrode layer 160 is formed on the trench T having the dielectric 140 formed thereon. The second electrode layer 160 may contact the first semiconductor layer 110 exposed through the trench T. Accordingly, in the light emitting device according to this embodiment, when a reverse voltage occurs due to an electrostatic discharge (ESD), a current may flow from the first semiconductor layer 110 to the second electrode layer 160 without passing through the active layer 120, so as to protect the active layer 120, for example, the light emitting region.

The second electrode layer 160 may be formed of at least one of titanium (Ti), chrome (Cr), nickel (Ni), aluminum (Al), platinum (Pt), gold (Au), tungsten (W), and a semiconductor substrate to which an impurity is injected, and may include an ohmic layer (not shown), a reflective layer 162, a junction layer (not shown), and a second substrate 164. Each of these layers is described further hereinbelow.

The second electrode layer 160 may include an ohmic layer that may be formed by stacking a material, such as a single metal, a metal alloy, a metal oxide, or other appropriate materials, in multiple layers to effectively inject holes. The ohmic layer may include at least one of ITO, IZO(In—ZnO), GZO (Ga—ZnO), AZO(Al—ZnO), AGZO(Al—GaZnO), IGZO (In—Ga ZnO), IrOx, RuOx, RuOx/ITO, Ni/IrOx/Au, Ni/IrOx/Au/ITO, or other appropriate materials.

The second electrode layer 160 may also include the reflective layer 162 or a junction layer (not shown). For example, when the second electrode layer 160 includes the reflective layer 162, the reflective layer 162 may be formed as a metal layer including Al, Ag, an alloy including Al, Ag, or other appropriate materials. A material such as aluminum or silver may effectively reflect light generated from an active layer to significantly improve an extraction efficiency, or optical efficiency, of a light emitting device. Further, when the second electrode layer 160 includes a junction layer, the reflective layer 162 may function as the junction layer, or a junction layer may be formed of a material such as nickel (Ni) or gold (Au).

The second electrode layer 160 may further include the second substrate 164. However, when the first semiconductor layer 110 of the first conductive type has a sufficient thickness of about 50 pm or greater, the the second electrode layer 160 may, alternatively, not include the second substrate 164. The second substrate 164 may be one of a metal, a metal alloy, a conductive semiconductor material, or another appropriate material having a high electrical conductivity to efficiently inject holes to the second substrate 164. For example, the second substrate 164 may be formed of copper (Cu), copper alloy (CuAlloy), Si, Mo, SiGe, or other appropriate materials.

A method of forming the second substrate 164 may be an electrochemical metal deposition method, a bonding method using eutectic metal, or other appropriate methods. For ease of explanation, an electrochemical metal deposition method is exemplified as a method of forming the second substrate 164 as illustrated in FIG. 5, but the present disclosure is not limited thereto. For example, the reflective layer 162 may be formed to fill the trench T, and then, the second substrate 164 such as a silicon substrate may be bonded onto the reflective layer 162.

After the second electrode layer 160 is formed, the first substrate 100 may be removed to expose the first semiconductor layer 110. The first substrate 100 may be removed using a high power laser, a chemical etching method, or other appropriate methods. For example, the first substrate 100 may be removed by physically grinding the first substrate 100.

Figure 6:
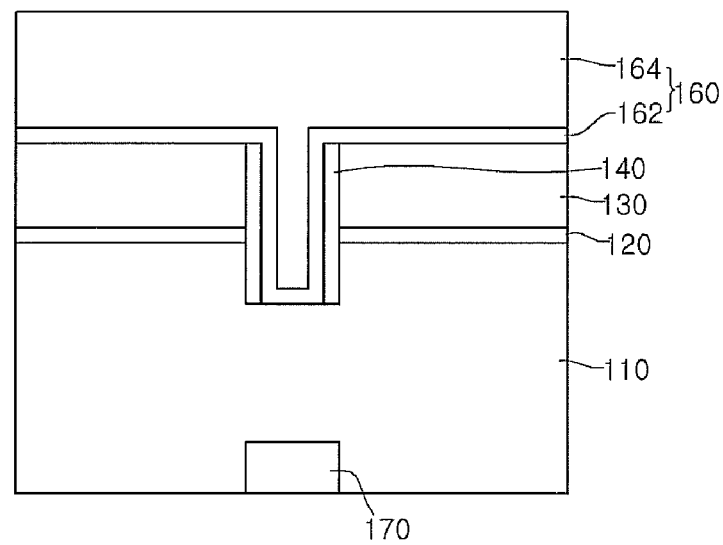

Thereafter, referring now to FIG. 6, the semiconductor region 170 of the second conductive type may be formed on the first semiconductor layer 110 of the first conductive type. For example, the semiconductor region 170 of the second conductive type may be provided by forming a second conductive type region in the first semiconductor layer 110 of the first conductive type through ion implantation, diffusion, or other appropriate processes.

The semiconductor region 170 of the second conductive type may be formed in a portion of the first semiconductor layer 110 of the first conductive type, which spatially, both laterally and vertically, corresponds to the trench T. For example, a third pattern (not shown) exposing a portion of the first semiconductor layer 110 at a location centered above the trench T may be used as a mask to implant p-type ions to form a p-type ion implantation region, but the present disclosure is not limited thereto. Next, referring to FIG. 7, the third pattern may be removed, and the first electrode layer 180 may be formed on the semiconductor region 170.

According to an embodiment, a photonic extraction structure may be formed on the light emitting structure. For example, a photonic extraction structure may be formed with a photonic crystal structure or roughness, but the present disclosure is not limited thereto.

In the light emitting device according to the current embodiment and the method of manufacturing the light emitting device, both a heterojunction and a homojunction may be formed together in the light emitting device. In this case, the homojunction of the light emitting device may protect the light producing active layer of the heterojunction from an ESD shock by allowing a reverse current to bypass the active layer into the second electrode layer. In addition, according to the current embodiment, current spreading due to the semiconductor region disposed under the second electrode may improve extraction efficiency of the light emitting device.

Figure 8:
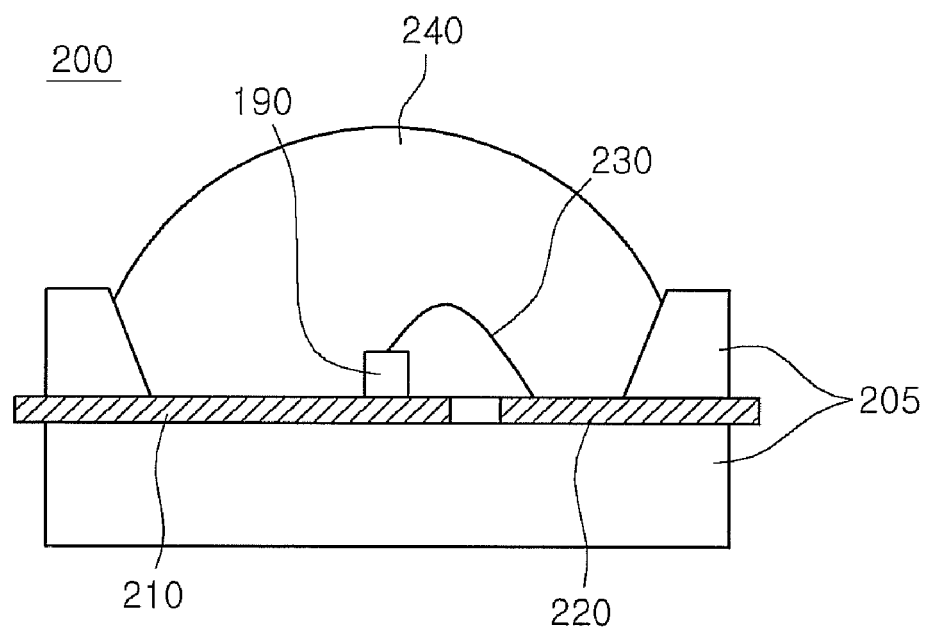
FIG. 8 is a cross-sectional view of a light emitting device package according to an embodiment.

Referring to FIG. 8, an light emitting device package 200 according to an embodiment includes a body 205, a third electrode layer 210 and a fourth electrode layer 220 disposed in the body 205, a light emitting device 190 disposed in the body 205 and electrically connected to the third electrode layer 210 and the fourth electrode layer 220, and a lens 240 surrounding the light emitting device 190.

The body 205 may be formed of a silicon material, a synthetic resin material, a metal material, or other appropriate material. Further, an inclined surface may be disposed around the light emitting device 190. The third electrode layer 210 and the fourth electrode layer 220 may be electrically separated from each other, and may supply power to the light emitting device 190. Also, the electrode layers 210 and 220 may reflect light generated by the light emitting device 190, to thereby improve optical efficiency. In addition, the electrode layers 210 and 220 may dissipate heat generated by the light emitting device 190.

The light emitting device 190 may be disposed on or recessed into the body 205, the third electrode layer 210, or the fourth electrode layer 220. The light emitting device 190 may be electrically connected to the third electrode layer 210 and/or the fourth electrode layer 220 through a wire 230. Simply for ease of explanation, the light emitting device 190 is disclosed as being a vertical type and having one wire 230 used to electrically connect the light emitting device 190. However, it is well appreciated that various types of light emitting devices may be used with various methods of electrically connecting the same. For example, although a vertical type light emitting device may be applicable as the light emitting device 190, a lateral type light emitting device may also be applicable.

The lens 240 may be molded on the package body 205 to protect the light emitting device 190. Also, the lens 240 may contain phosphor to vary a wavelength of light emitted from the light emitting device 190.

The light emitting device package according to an embodiment may be applicable to a lighting system. The lighting system may include a lighting unit illustrated in FIG. 9 and a backlight unit illustrated in FIG. 10. In addition, the lighting system may include traffic lights, a vehicle headlight, a sign, and other appropriate devices that require a light source.

Figure 9:
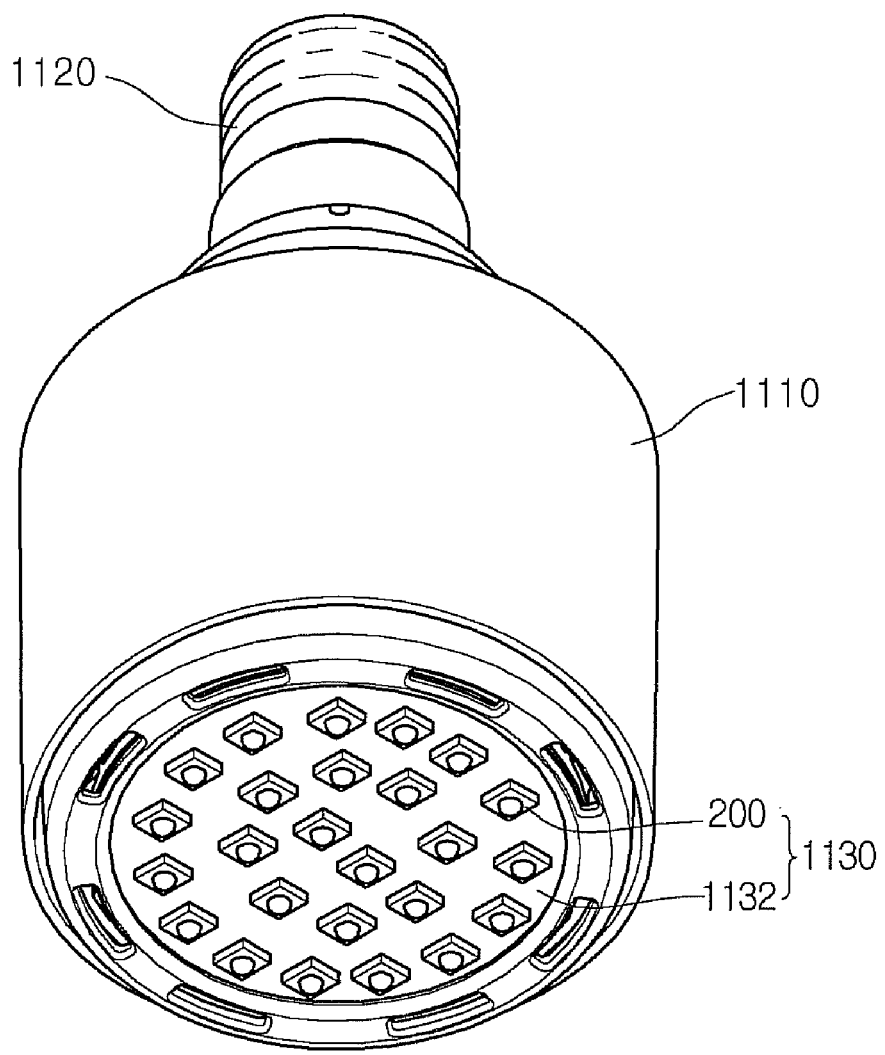
FIG. 9 is a perspective view of a lighting unit according to an embodiment.

Referring to FIG. 9, a lighting unit 1100 may include a case body 1110, a light source 1130 disposed in the case body 1110, and a connection terminal 1120 disposed in the case body 1110 to receive power from an external power source. The case body 1110 may be formed of a material having an improved heat dissipation characteristic. For example, the case body 1110 may be formed of a metal material or resin material.

The light source 1130 may include a substrate 1132 and at least one LED package 200 mounted on the substrate 1132. A circuit pattern may be printed on an insulation material on the substrate 1132. For example, the substrate 1132 may include a printed circuit board (PCB), a metal core PCB (MCPCB), a flexible PCB (FPCB), or a ceramic PCB. Also, the substrate 1132 may be formed of a material that may effectively reflect light. A surface of the substrate 1132 may also be coated with a colored material, for example, a white or silver-colored material that may effectively reflect light.

The at least one LED package 200 may be mounted on the substrate 1132. The LED package 200 may include at least one LED chip 100. The LED chip 100 may include a colored LED that may emit red, green, blue, or white light and a UV LED that emits UV light. The light source 1130 may include a plurality of LED packages 200 to obtain various colors and brightness. For example, a combination of a white LED, a red LED, and a green LED may be positioned together to provide a high color rendering index (CRI).

Figure 7:
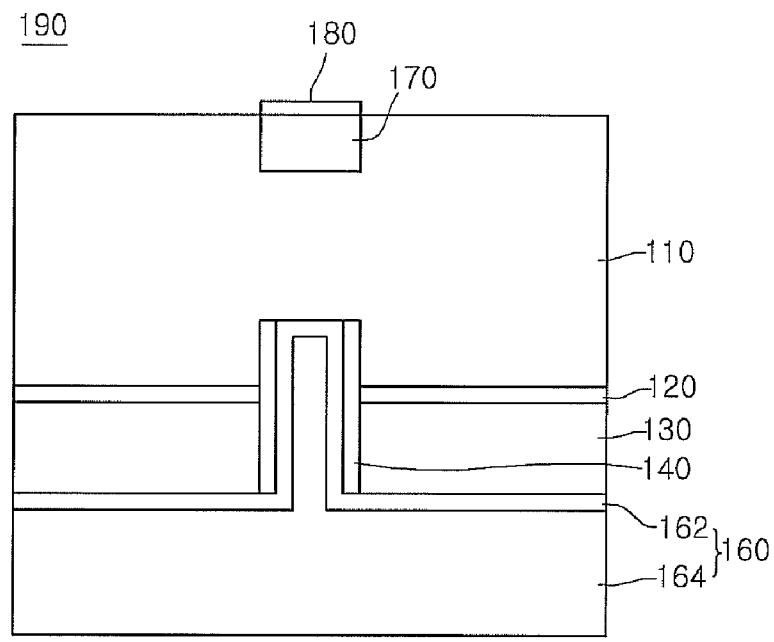

The connection terminal 1120 may be electrically connected to the light emitting module 1130 to supply power. Although the connection terminal 1120 as shown in FIG. 7 may be screw-inserted into a socket of an external power source, the present disclosure is not limited thereto. For example, the connection terminal 1120 may have a pin shape. Thus, the connection terminal 1120 may be inserted into the external power source or connected to the external power using various interconnections.

Figure 10:
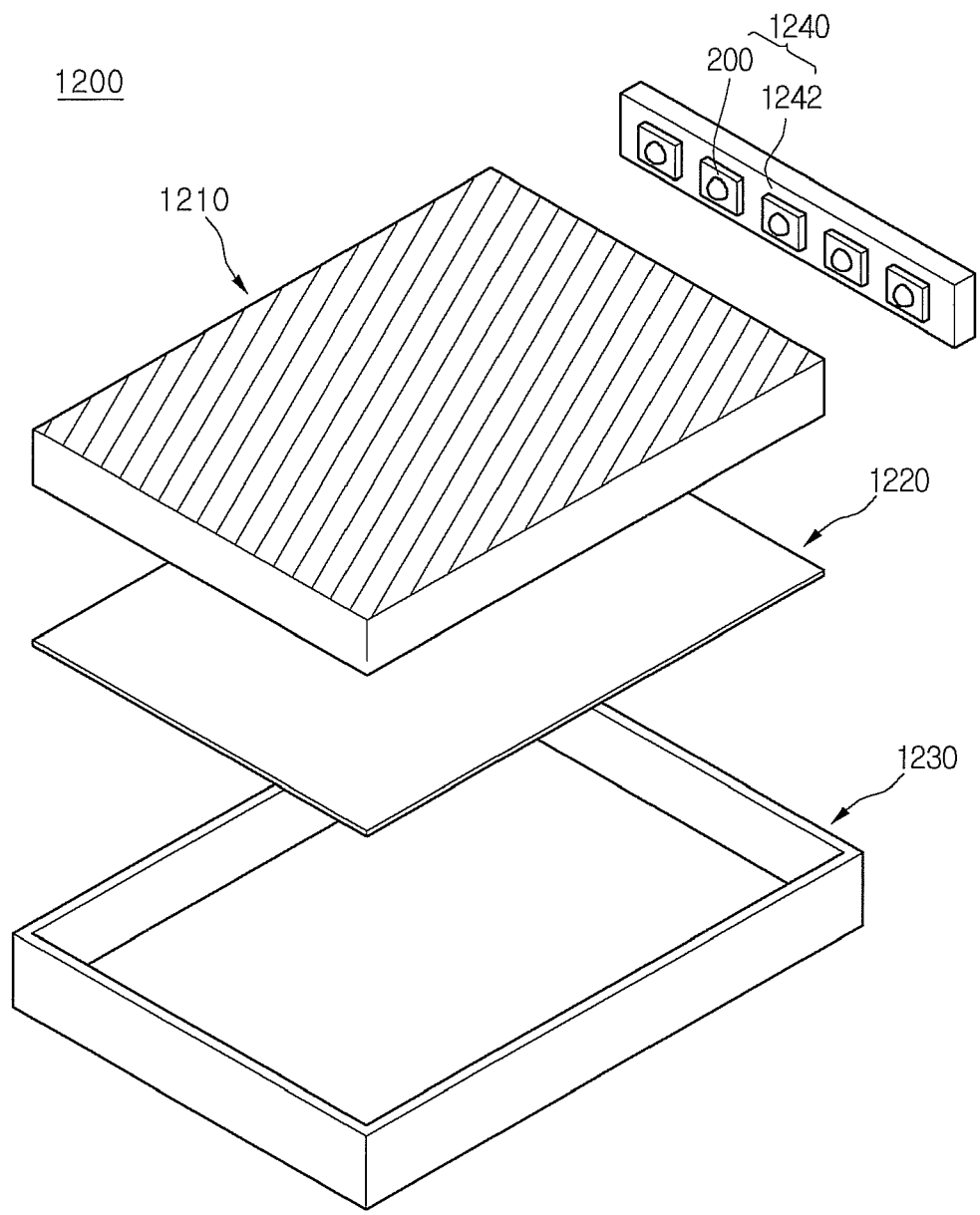
FIG. 10 is an exploded perspective view of a backlight unit according to an embodiment.

FIG. 10 is an exploded perspective view of a backlight 1200 according to an embodiment. A backlight 1200 according to this embodiment may include a light guide plate 1210, a light source 1240, a reflector 1220, and a bottom cover 1230. The light source 1240 may provide light to the light guide plate 1210. Further, the reflector 1220 may be disposed below the light guide plate 1210. The bottom cover 1230 may receive the light guide plate 1210, the light source 1240, and the reflector 1220.

The light guide plate 1210 may diffuse light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a polycarbonate (PC) resin, a cyclic olefin copolymer (COC) resin, or a polyethylene naphthalate (PEN) resin. The light source 1240 may provide light to at least one surface of the light guide plate 1210. Thus, the light source 1240 may be used as a light source of a display device that includes the backlight unit 1200.

The light source 1240 may be positioned to contact the light guide plate 1210 or may be positioned apart from the light guide plate. In particular, the light source 1240 may include a substrate 1242 and a plurality of LED packages 200 mounted on the substrate 1242. The substrate 1242 may contact the light guide plate 1210, but is not limited thereto. Additionally, the substrate 1242 may be a PCB including a circuit pattern (not shown). The substrate 1242 may also include a metal core PCB (MCPCB), a flexible PCB (FPCB), a ceramic PCB, or other appropriate types of circuit boards.

A light emitting surface of each of the plurality of LED packages 200 may be spaced a predetermined distance from the light guide plate 1210. The reflector 1220 may be disposed below the light guide plate 1210. The reflector 1220 reflects light incident on a bottom surface of the light guide plate 1210 to be reflected in an upward direction, thereby improving brightness of the backlight unit. The reflector 1220 may be formed of, for example, PET, PC, PVC resins, or other appropriate types of materials.

The bottom cover 1230 may receive the light guide plate 1210, the light source 1240, and the reflector 1220. For example, the bottom cover 1230 may have a box shape with an opened upper side. The bottom cover 1230 may be formed of a metal material, a resin material, or other appropriate material. Also, the bottom cover 1230 may be manufactured using a press forming process, an extrusion molding process, or other appropriate manufacturing process.

Embodiments disclosed herein provide a light emitting device that can prevent damage due to electrostatic discharge, a light emitting device package, and a lighting system including the light emitting device and the light emitting device package.

In one embodiment, a light emitting device may comprise a light emitting structure comprising a first conductive type semiconductor layer, an active layer under the first conductive type semiconductor layer, and a second conductive type semiconductor layer under the active layer; a second electrode layer under the light emitting structure, wherein the second electrode layer comprises a protrusive region which penetrates the second conductive type semiconductor layer and the active layer, and contacts the first conductive type semiconductor layer; a dielectric surrounding a side of the protrusive region of the second electrode layer; a second conductive type region on the first conductive type semiconductor layer; and a first electrode on the second conductive type region.

In the embodiments as disclosed herein, it is well understood that when a layer (or film) is referred to as being 'on' another layer or substrate, it may be directly on another layer or substrate, or intervening layers may also be present. Further, it is well understood that when a layer is referred to as being 'under' another layer, it may be directly under another layer, and one or more intervening layers may also be present. In addition, it is well understood that when a layer is referred to as being 'between' two layers, it may be the only layer between the two layers, or one or more intervening layers may also be present.

A light emitting device is disclosed herein comprising a first semiconductor layer of a first conductivity type, the first semiconductor layer having a recess; an active layer adjacent to the first semiconductor layer, the active layer having a first opening; a second semiconductor layer of a second conductivity type adjacent to the active layer, the second semiconductor having a second opening; a semiconductor region of a second conductivity type on the first semiconductor layer; a first electrode on the semiconductor region; a second electrode layer adjacent to the second semiconductor layer, wherein the first and second openings and the recess are substantially aligned, and the second electrode layer includes a protrusive portion which extends into the first and second openings and the recess to contact the first semiconductor layer; and a dielectric layer formed on a side wall of at least one of the first opening, second opening or the recess, such that the protrusive portion does not contact the active layer and the second semiconductor layer.

The second electrode layer of the light emitting device may comprise a reflective layer. The semiconductor region of the light emitting device may comprise a heavily doped semiconductor region. The first conductivity type may be an n-type, the second conductivity type may be a p-type, and the semiconductor region may be doped with p-type dopant. Further, the first conductivity type may be a p-type, the second conductivity type may be an n-type, and the semiconductor region may be doped with n-type dopant. The at least a portion of the semiconductor region of the light emitting device may spatially overlap an at least one of the first opening, the second opening or the recess. Further, an upper side of the protrusive portion of the second electrode layer may contact the first semiconductor layer and the other area of the second electrode layer except the protrusive portion contacts the second semiconductor layer. A current may flow through the active layer when a forward voltage is applied to the first and second electrodes, and a current may flow through the protrusive portion when a reverse voltage is applied to the first and second electrodes. A light emitting device package may include the light emitting device, and further may include a package body provided to house the light emitting device.

A method of manufacturing a light emitting device is disclosed herein, the method comprising forming a first semiconductor layer of a first type adjacent to a substrate; forming an active layer adjacent to the first semiconductor of the first type; forming a second semiconductor layer of a second type adjacent to the active layer; etching a recess through the second semiconductor and the active layers into the first semiconductor layer such that a bottom surface of the recess contacts the first semiconductor layer; forming a dielectric layer on a side surface of the recess; forming a second electrode layer adjacent to the second semiconductor layer, wherein the second electrode layer includes a protruding portion positioned inside the recess such that the second electrode layer makes electrical contact with the first semiconductor layer, but is electrically insulated from the active layer and the second semiconductor layer; removing the substrate from the first semiconductor layer; forming a semiconductor region of the second conductivity type on a surface of the first semiconductor layer; and forming a first electrode layer on the semiconductor region.

The method step of forming the second electrode layer comprises forming a reflective layer. The method step of forming the semiconductor region comprises forming a heavily doped semiconductor region. The first conductivity type may be an n-type, the second conductivity type may be a p-type, and the semiconductor region may be doped with p-type dopant. Further, the first conductivity type may be a p-type, the second conductivity type may be an n-type, and the semiconductor region may be doped with n-type dopant. The method step of forming the semiconductor region further comprises positioning the semiconductor region to spatially overlap at least a portion of the recess. The method step of forming the second electrode layer further comprises positioning an end of the protrusive portion of the second electrode layer to contact the first semiconductor layer and positioning the other area of the electrode layer except the protrusive portion to contact the second semiconductor layer. The method of manufacturing the light emitting device may further comprise applying a forward voltage to the first and second electrodes to cause a current to flow through the active layer, and applying a reverse voltage to the first and second electrodes to cause a current to flow through the protrusive portion. The method may further comprise housing the light emitting device in a package body of a light emitting device package.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first semiconductor layer of a first conductivity type, the first semiconductor layer having a recess;
   an active layer on the first semiconductor layer, the active layer having a first opening;
   a second semiconductor layer of a second conductivity type adjacent to the active layer, the second semiconductor having a second opening;
   a semiconductor region of a second conductivity type in the first semiconductor layer;
   a first electrode on the semiconductor region;
   a second electrode adjacent to the second semiconductor layer, wherein the first and second openings and the recess are substantially aligned, and the second electrode includes a protrusive portion which extends into the first and second openings and the recess to contact the first semiconductor layer; and
   a dielectric layer formed on a side wall of at least one of the first opening, second opening or the recess, such that the protrusive portion does not contact the active layer and the second semiconductor layer,
   wherein the first semiconductor layer of first conductive type, the active layer, and the second semiconductor layer of the second conductive type form a light emitting structure, and
   wherein the first electrode is directly disposed on the semiconductor region and the first electrode is formed only over an upper surface of the semiconductor region.

2. The light emitting device of claim 1, wherein the semiconductor region comprises a second conductive ion implantation region or a second conductive diffusion region.

3. The light emitting device of claim 1, wherein the semiconductor region is formed on a predetermined portion of the first semiconductor layer opposite to a protrusive portion of the second electrode, such that the semiconductor region spatially overlaps the protrusive portion.

4. A light emitting device, comprising:
   a first semiconductor layer of a first conductivity type, the first semiconductor layer having a recess;
   an active layer on the first semiconductor layer, the active layer having a first opening;
   a second semiconductor layer of a second conductivity type adjacent to the active layer, the second semiconductor having a second opening;

a semiconductor region of a second conductivity type in the first semiconductor layer;

a first electrode on the semiconductor region;

a second electrode layer adjacent to the second semiconductor layer, wherein the first and second openings and the recess are substantially aligned, and the second electrode layer includes a protrusive portion which extends into the first and second openings and the recess to contact the first semiconductor layer; and a dielectric layer formed on a side wall of at least one of the first opening, second opening or the recess, such that the protrusive portion does not contact the active layer and the second semiconductor layer, wherein the first semiconductor layer of first conductive type, the active layer, and the second semiconductor layer of the second conductive type compose a light emitting structure, and wherein the protrusive portion of the second electrode is directly disposed on the first semiconductor layer exposed by the recess.

5. The light emitting device of claim 1, wherein the second electrode layer comprises a reflective layer.

6. The light emitting device of claim 1, wherein at least a portion of the semiconductor region spatially overlaps at least one of the first opening, the second opening or the recess.

7. The light emitting device of claim 1, wherein a distal surface of the protrusive portion of the second electrode contacts the first semiconductor layer and a surface of the second electrode layer adjacent to the protrusive portion contacts the second semiconductor layer.

8. The light emitting device of claim 1, wherein a current flows through the active layer when a forward voltage is applied to the first and second electrodes, and a current flows through the protrusive portion when a reverse voltage is applied to the first and second electrodes.

9. The light emitting device of claim 1, wherein the first conductivity type is an n-type, the second conductivity type is a p-type, and the semiconductor region is doped with p-type dopant.

10. The light emitting device of claim 1, wherein the first conductivity type is a p-type, the second conductivity type is an n-type, and the semiconductor region is doped with n-type dopant.

11. A lighting system including a light emitting device package, wherein the light emitting device package includes the light emitting device of claim 1, and further including a package body provided to house the light emitting device.

12. The light emitting device of claim 4, wherein the semiconductor region comprises a second conductive ion implantation region or a second conductive diffusion region.

13. The light emitting device of claim 4, the semiconductor region is formed on a predetermined portion of the first semiconductor layer opposite to a protrusive portion of the second electrode layer, such that the semiconductor region spatially overlaps with the protrusive portion.

14. The light emitting device of claim 4, wherein at least a portion of the semiconductor region spatially overlaps at least one of the first opening, the second opening or the recess.

15. The light emitting device of claim 4, wherein an upper side of the protrusive portion of the second electrode layer contacts the first semiconductor layer and the other area of the second electrode layer except the protrusive portion contacts the second semiconductor layer.

16. The light emitting device of claim 4, wherein the first conductivity type is an n-type, the second conductivity type is a p-type, and the semiconductor region is doped with p-type dopant.

17. The light emitting device of claim 4, wherein a lateral width of the first electrode is substantially the same as a lateral width of the semiconductor region of the second conductivity.

18. The light emitting device of claim 1, wherein a lateral width of the first electrode is substantially the same as a lateral width of the semiconductor region of the second conductivity.

* * * * *